United States Patent [19]

Conte et al.

[11] Patent Number: 4,807,298

[45] Date of Patent: Feb. 21, 1989

[54] METHOD OF AND SYSTEM FOR DIGITAL SIGNAL CODING BY VECTOR QUANTIZATION

[75] Inventors: Garibaldi Conte, San Severo; Mario Guglielmo, Montalenghe; Fabrizio Oliveri, Quiliano, all of Italy

[73] Assignee: Cselt-Centro Studi E Laboratori Telecomunicazioni S.P.A., Turin, Italy

[21] Appl. No.: 34,025

[22] Filed: Apr. 1, 1987

[30] Foreign Application Priority Data

Apr. 7, 1986 [IT] Italy .................... 67273 A/86

[51] Int. Cl.$^4$ ........................................ G06K 9/36
[52] U.S. Cl. ............................... 582/56; 582/21; 582/41; 340/737; 364/518
[58] Field of Search ............... 340/737, 739; 364/518, 364/521, 522, 523, 718, 719, 720; 382/56, 21, 23, 41, 44, 49; 358/133, 135, 136, 137, 138, 260, 263

[56] References Cited

U.S. PATENT DOCUMENTS 4,541,012  9/1985  Tescher .............................. 358/133
4,670,851  6/1987  Murakami et al. ................. 364/518

OTHER PUBLICATIONS

Abend, K. et al., "Classification of Binary Random Patterns", *IEEE Trans. on Inf. Theory*, pp. 530-544, vol. IT-11, No. 4, Oct. 1965.

Patrik, E. A. et al., "Mapping Multidimensional Space to One Dimension for Computer Output Display", *IEEE Trans. Computers*, vol. C-17, Oct. 1963, pp. 949-953.

Bially, T., "Space-filling Curves: Their Generation and Their Application to Bandwidth Reduction", *IEEE Trans. Inf. Theory*, vol. IT-15, Nov. 1969, pp. 658-664.

"Quantizing for Maximum Distortion", Joel Max, *IRE Transactions Theory*, Mar. 1960.

"Alternative Algorithm for Hilbert's Space-Filling Curve", Arthur R. Butz, *IEEE Transactions on Computers*, Apr. 1971.

"An Algorithm for Vector Quantizer Design", Y. Linde et al., *IEEE Transactions on Communications*, Jan. 1980.

*Primary Examiner*—Leo H. Boudreau
*Assistant Examiner*—Jose L. Couso
*Attorney, Agent, or Firm*—Herbert Dubno

[57] ABSTRACT

The method of and the device for digital signal coding by vector quantization exploit representation of signal portions in a one-dimensional space for vector codebook generation and for coding for transmission and/or storage purposes. The n-dimensional sampling is transformed into coordinates in one-dimensional space preferably in accordance with Hilbert's curve.

17 Claims, 5 Drawing Sheets

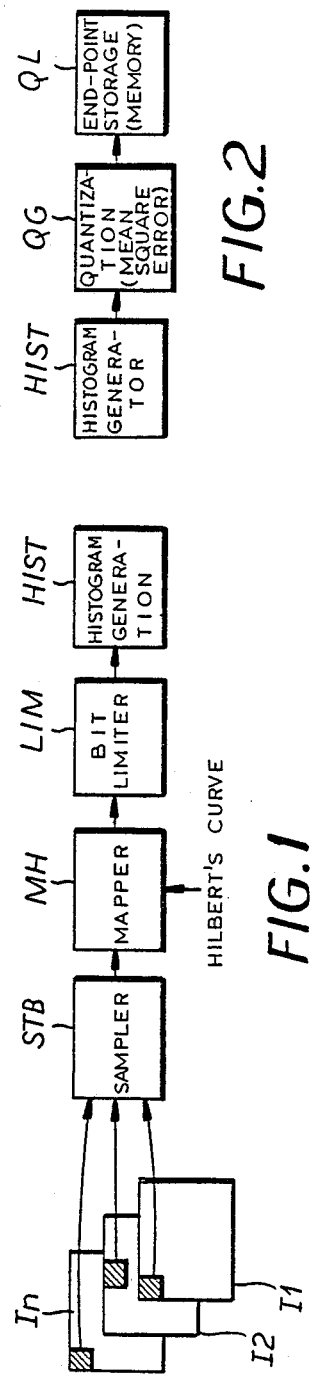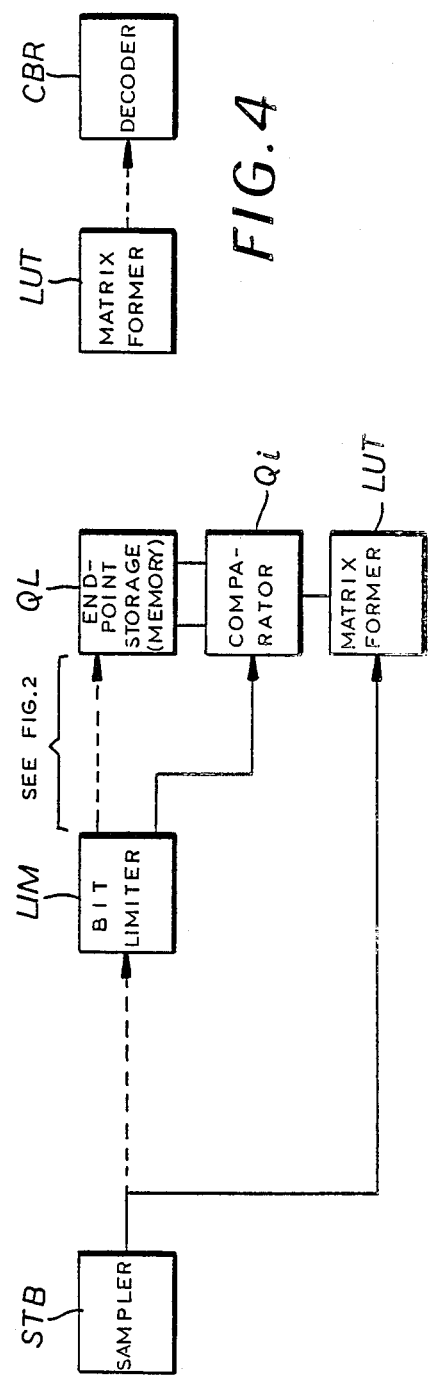

METHOD OF AND SYSTEM FOR DIGITAL SIGNAL CODING BY VECTOR QUANTIZATION

FIELD OF THE INVENTION

Our present invention relates to a method of and a system for digital signal coding by vector quantization. More particularly, the invention relates to vector quantization for the coding of digital signals used in image signal transmission and/or storage systems, for redundancy reduction purposes, although the invention has general applicability to the processing of digital signals.

BACKGROUND OF THE INVENTION

Vector quantization is a type of quantization in which a set of samples conveiently extracted from the signal to be coded is taken into account, instead of a single sample. For example, in the case of image signals, the matrix formed by the samples obtained from the signal by orthogonal sampling is scanned by rows and samples are extracted from a number of rows successive in time (e.g. two or four samples for each of two successive rows, or four samples for each of four successive rows) are quantized together. Blocks of $2\times2$, $2\times4$ or $4\times4$ samples, respectively, are thus obtained.

Considering, for example, the $2\times4$ case, if the samples are represented by 8 bits (corresponding to 256 quantization levels per sample), as stated in CIRR recommendation 601, the number of possible configurations is $256^8$, which must be represented by 64 bits.

Through vector quantization techniques the number of possible configurations is reduced and becomes variable, typically within 1024 and 128; if the configurations are equiprobable, just 10 and 7 bits are required for their representation.

Vector quantization is a potentially better algorithm than others, since it not only permits considerable redundancy reduction, but also allows exploitation of statistical dependency amon the variables to be coded (in this case the image points) and not only to correlation; yet its implementation gives rise to two problems.

The first problem concerns codebook generation, i.e. the indentification, based upon a particular distortion minimization criterion, of the most probable values of the set of variables, namely identification of the regions of an n-dimensional space, where higher values density exists. In this particular case the 1024 or 128 configurations (or code vectors) representing the possible $256^8$ quantized signal configurations, are to be obtained.

The second problem concerns the identification of the vector to be used for representation of the generic block, always taking into account the distortion minimizations criterion.

A known solution to the codebook generation problem is described by Y. Linde, A Buzo and R.M. Gray in the paper entitled "An Algorithm for Vector Quantizer Design", *IEEE Transactions on Communications*, Vol. Com-28, No.1, Jan. 1980.

This paper describes an iterative algorithm which, in the most usual application, computes in a first step the centroid of the set of the vectors relevant to a sequence of training signals. The centroid is then multiplied by a scalar quantity thus identifying non-optimized representative points of two hypothetical classes of such a set. By use of these two representative classes, this set is partioned, allotting each of the vectors to either calss. As a third step, the actual centroid of each of the two classes obtained is calculated. The same operations are repeated for the two new centroids and so on until the desired number of representative vectors is obtained.

Once the codebook is built up, the actual coding can be effected either by comparison of each vector to be coded with all the representative vectors and consequent choice of the one which minimzes the distortion, or by a selective tree technique.

This known method can be applied whatever distortion criterion is to be satisfied. However, the codebook generation method is particularly inefficient due to the large number of operations to be performed on the training sequence, and is also rather complicated since the analysis on the set is performed in an n-dimensional space. The coding phase, if the comparison technique is chosen, is very time consuming due to the necessity of making comparisons with the whole codebook, and does not allow direct identification of the vector representative of the block to be coded. In the case of a selective tree technique, the number of comparisons is reduced, but optimal representation is not ensured.

OBJECT OF THE INVENTION

It is the object of our present invention to provide an improved method of and an improved system or device for digital signal coding by vector quantization which will overcome these drawbacks.

SUMMARY OF THE INVENTION

In the case in which the adopted distortion criterion is that of minimizing the Euclidean distortion (i.e. the mean square error), the foregoing disadvantages are overcome by the method and device of the invention, which allow codebook generation without resorting to interative methods and in a less complicated way, since the analysis of the set of variable is effected in a one-dimensional space, and which also allow a direct identification of the vector representative of the block.

The limitation inherent in the possiblity of applying the invention only to that particular distortion criterion (i.e. minimizing the mean square error) is not particularly severe, since this it the criterion most generally used in signal processing.

The method of the invention of coding a digital signal by vector quantization comprises subdividing the signal into blocks to be coded in sequence and comprising each a predetermined number of samples which are coded at the same time, each block being representable as a vector identifying a point in an n-dimensional space (n=number of samples in a block) and having n components whose values represent the values of the individual samples.

For each block to be coded, the coordinates of the point in the n-dimensional sapce are transformed into the coordinates of a point in a one-dimensional space by a mapping preserving in the one-dimensional space the adjacency properties of the n-dimensional space. The coordinates obtained in this way are compared with the values of the coordinates of the end points of a plurality of adjacent intervals in the one-dimensional space, each interval being associated with an index forming the coded value of the points falling within that interval. During coding, this index selects a vector from a previously determined codebook, consisting of the mean values of the vectors falling in the interval.

The invention provides also a device or system for carrying out the method, and comprising a coder (COD) comprising means (STB) subdividing into blocks the signal to be coded and calculating, for each block, the coordinates of a representative point in the n-dimensional space, and a decoder (DEC) comprising means (BTS) building up again the block of samples starting from a vector and combining the blocks into a decoded signal. The coder (COD) can comprise:

a first logic network (MH) which, for each block, calculates the cooridnate of a point which, in a one-dimensional space, corresponds to the point representative of the block in the n-dimensional space;

a first memory (QL) which stores the values of the cooridnates of the end points of a plurality of intervals the one-dimensional space is divided into, and an index associated with each interval; and comparison logic network (Qi) which receives the one-dimensional coordinate of each signal block to be coded, compares the coordinate with those of the end points of the intervals to detect the interval where the coordinate falls and reads in the first memory (Qi) and supplies, as a coded signal, the value of the index of such an interval.

Advantageously, the decoder (DEC) comprises a second memory (CBR), addressed during reading by these indices and storing a codebook consisting of the means values of the signal blocks falling in each interval.

BRIEF DESCRIPTION OF THE DRAWING

The above and other objects, features and advantages of the invention will become more readily apparent from the following description, reference being made to the accompanying drawing, in which:

FIGS. 1-4 are block diagrams depicting codebook generation by the method of the invention;

SPECIFIC DESCRIPTION

Figure 5:
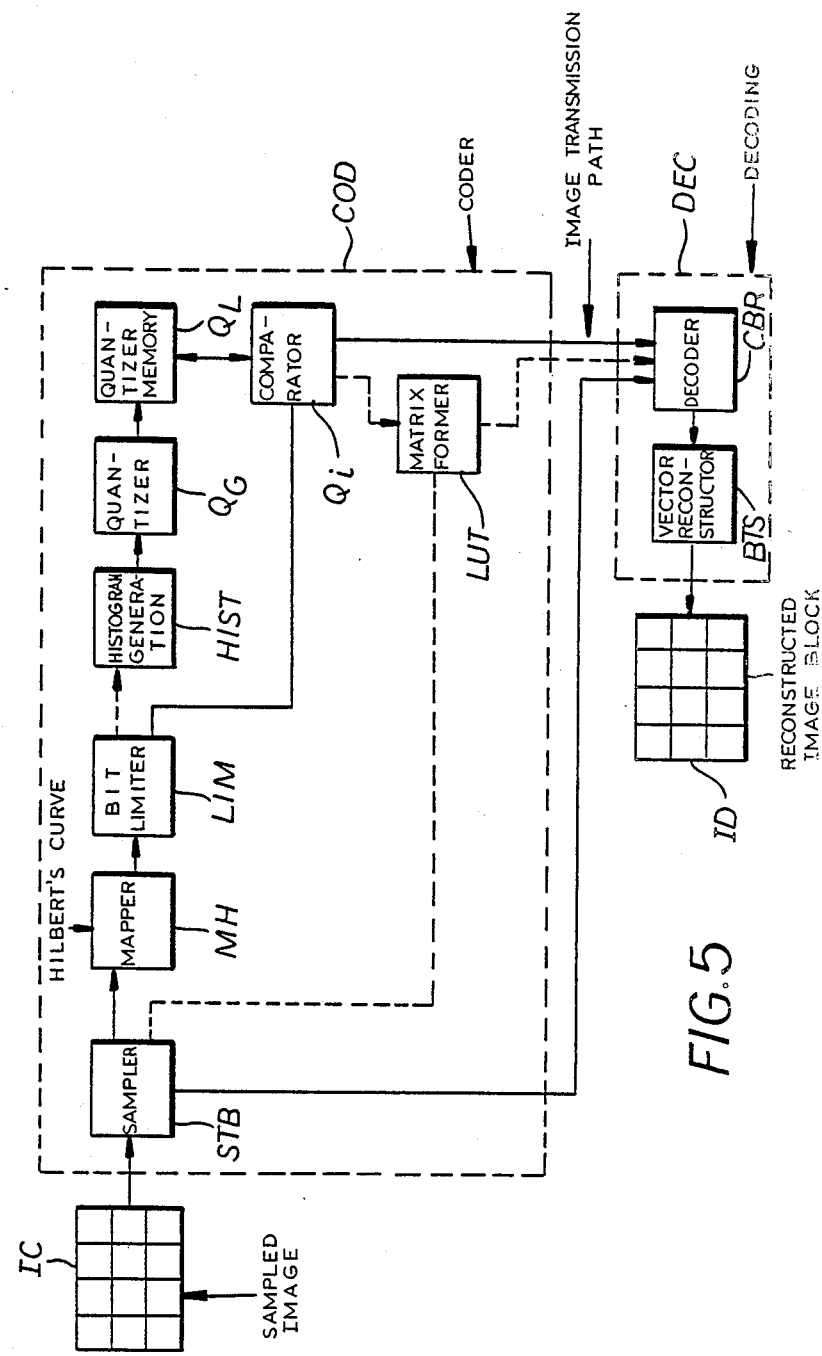
FIG. 5 is a block diagram of the device according to the invention.

Codebook generation is disclosed first, it being assumed that such generation is effected starting from a training image sequence.

Codebook generation takes place in a plurality of steps;

First a mapping from the n-dimensional space to a one-dimensional space is calculated, and a histogram of the distribution of the representative points in such a one-dimensional space is determined. Next, a quantization law in this one-dimensional space is determined, which law minimizes mean square error. Finally, the actual codebook is calculated.

For the histogram determination, a sequence of training images I1, I2... In (FIG. 1) is submitted to orthogonal sampling in order to obtain a sample matrix, and samples extracted from a certain number of successive rows are quantized together.

More particularly, s samples of each of r successive rows are quantized together, thereby obtaining a block of n=r.s samples. By way of example, whenever necessary, reference will be made to blocks of 4 samples per row and to 4 rows sampled successively in time, so that a 16-dimensional space is considered.

The sampling is performed by a device STB, which, for each block, calculates the values of the image elements forming the block and organizes such values into sequential form, according to a predetermined law. A point, and hence a vector, in the n-dimensional space is associated with each such block. element is the only luminance value and that such a value is coded by 8 bits, each coordinate of the point in the n-dimensional space can have value 0 ... 255.

It is also to be noted that the values utilized can be either the actual values or values from which there has been subtracted a mean luminance value of the block itself, coded in any known way, e.g. in PCM by 4 bits.

A mapping from the n-dimensional space to a one-dimensional space is performed by a mapper (block MH) for the vector formed by the sampler STB for each block. This mapping is the essential step of the coding method of the invention: it must present ease of computation, and hence of circuit implementation, and a good preservation of adjacency properties, i.e. must be such that points which are near one another in a region of the n-dimensional space remain so in the one-dimensional space. This property is essential because mapping from n dimensions to one dimension might give rise to a random dispersion of the points of a given region all over the one-dimensional space, making coding inefficient. These requirements are satisfied by the use of so-called "space filling curves", knwon also as Peano's curves. Among these curves, Hilbert's curve has been chosen as the best mode embodiment which, being of a binary base, is well-suited to be implemented by electronic circuits operating in a binary logic. By associating each point of the n-dimensional space with a curve point, the latter can be identified by a single coordinate, representing the distance from the curve origin.

The mapping consists then in determining, for each point of the n-dimensional space, the value of the coordinate of the corresponding point on the curve, which is obtained by suitable permutation operations on the individual bits of the words representing the coordinates of the point in the n-dimensional space.

Advantageously, the mapping performed for the passage from n to 1 dimensions is an inverse mapping of that described by A.R. Butz in the paper entitled "Alternative Algorithm for Hilbert's Space Filling Curve", *IEEE Transactions on Computers*, Vol. C-20, 1971, pages 424–426, disclosing the mapping from one dimension to n dimensions.

The step subsequent to the mapping is the generation of a histogram of the coordinates of the points on the Hilbert's curve.

If m is the number of bits coding each coordinates in an n-dimensional space, each value of the curvilinear coordinate would be represented by m.n. bits, and histogram generation would require the use of a $2^{m.n}$-position memory. Considering that typical values for m and n are those previously stated (8 bits, 16 dimensions) it is evident that the size required for such a memory ($2^{128}$ positions) cannot be utilized in practice and hence the number of values the curvilinear coordinate can assume should be reduced.

For this reduction, denoted by limiter block LIM, a uniform quantization is performed, i.e. the Hilbert's curve is split into equal length intervals.

If L is the number of intervals to be used for the coding, quantization performed in the quantizer connected to the mapping circuit results in a splitting of the curve into for example, K=10.L intervals. For instance, with the values stated above for n and m, L can be 1024 and K can be about 10,000; the histogram memory can have $2^{13}$–$2^{14}$ positions.

The uniform quantization can be performed through a simple truncation of the words supplied by MH, i.e. by keeping only the $x = \lceil \log K \rceil$ most significant bits of such words (the symbol $\lceil \; \rceil$ indicates the upper integer of the quantity contained inside it).

A more efficient method can calculate a maximum value $H_M$ of the coordinates supplied by MH and a normalizing value $\hat{H}i$ of the generic coordinate $\hat{H}i$ by relation $$\hat{H}i = \frac{K \cdot Hi}{H_m}.$$

where K is the histogram dimension. If this method is chosen, during the mapping from n to 1 dimensions the values obtained ought to be stored to prevent repetitions of the operations described.

After information reduction within acceptable values, the actual histogram (block HIST) is generated. To this end the normalized or limited value relevant to each image block increments by a unit the contents of the histogram-creating memory, at the address corresponding to the value itself. The histogram will consist of a series of peaks separated by zones corresponding to quantization intervals where no points fall or very few points fall. These peaks correspond to dominant configurations in the training image and their number indicates a minimum possible number of coding levels for the images.

The second step (FIG. 2) is quantization of the histogram according to the law which minimizes the mean square error quantization (block QG). The quantization corresponds to finding the abscissae bounding the various peaks and, if the number of peaks is not equal to the desired interval number, to partitioning the peaks giving rise to the highest mean square error (if the peak number is less than the interval number) or to regrouping the peaks with the lowest mean square error, in the opposite case, until the desired interval number of intervals is obtained.

The operation effected in quantizer QG results in storing the end points of the quantization intervals and point storage (block QL) and the values representative of the intervals. The latter values are not utilzied, as will be explained later.

Various algorithms can be applied to obtain such values. For example, we can use the direct resolution of the system of non-linear equations defining error minimization conditions, as described by J. Max in the paper entitled "Quantizing for Minimum Distortion", *IRE Transactions on Information Theory*, Vol. IT-9, Mar. 1960, pages 7–12, or the iterative computation of the centroids of successive partitions obtained starting from an arbitrary partition.

The inverse mapping of the one applied in the mapping circuit can be applied to the values of the points representative of the intervals to obtain the codebook from the stored values. However, taking into account that only a portion of the word representing the curvilinear coordinate is available, and not the whole word, this operation can be inacurate. Preferably, therefore, codebook vectors are directly computed by an averaging operation solely requiring the knowledge of the interval end points; that is why the storage in the quantization memory QL of the points representing the single intervals is unnecessary.

For the direct computation (third step) as seen in FIG. 3, the values of the coordinates of the individual blocks of the training images, supplied the limiting circuit LIM, are compared (comparator block Qi) with the values of the coordinates of the end points of the various intervals obtained by histograms quantizations in the quantizor QL. These values are read in the quantization memory QL. In this way the interval in which a given image block falls is detected. The interval is indicated by its serial number or index i. Using such as index and the corresponding n-component vector outgoing from the subdivision circuit STB, there are built up by a matrix forming circuit LUT a matrix with as many rows as there are the vectors forming the codebook and as many columns as there are components of the vectors outgoing from the subdivision circuit STB, and a vector with as many components as there are matrix rows.

The matrix and vector contents are reset to 0 at the beginning of codebook generations operations. For each vector outgoing from the subdivision circuit STB, when the comparison memoyr logic Qi supplies the matrix-forming circuit with number i of the interval in which the vector image determined by the first logic network MH and LIM falls, the values of the vector components are added to the contents of row i of the matrix, while the content of position i of the vector is incremented by a unit.

Once the training image blocks have been exhausted, the content of each matrix row is divided (FIG. 4) by the content of the corresponding vector position, thus obtaining the mean values of the vectors whose one-dimensional images fall in each quantization interval. The computed means values form the codebook which is then transferred in whatever suitable way to a memory of the decoder CBR; e.g. if the coding system is part of an image transmission system, the codebook can be transferred to the decoder CBR using the system transmission line.

Once the codebook is obtained and transferred into the decoder, it is possible to proceed with the coding of any image, using the mapping from an n-dimensional to a one-dimensional space by the Hilbert's curve. This coding consists in determining index i of the interval in which the one-dimension coordinate of the block falls, such an index forming the coded signal to be transmitted or stored. During decoding, value i will act as an address to read the corresponding vector in the codebook.

The coder-decoder diagram is shown in FIG. 5, where the same symbols as in the previous Figures are used. Blocks STB, MH, LIM, Qi, QL form decoder COD; the decoder consists of block CBR And of a further block BTS which will be described hereinafter.

In this diagram, a device STB splits into blocks and reorganizes the samples of an image IC to be coded.

A first logic network MH computes for each block the coordinate value on Hilbert's curve, and supplies the value to a circuit LIM executing the operations described for the homonymous block of FIG. 1.

A comparison logic network Qi receives the values supplied by the bit limiter LIM and compares them with the end points of quantization intervals stored in a first or quantizer memory QL, determining index i corresponding to current image block.

Still considering the case of an image transmission system, the index i is transmitted to a second memory CBR Where it causes the reading of the vector contained in the i-th row. The vector is supplied to a device BTS, (vector reconstructor) carrying out on the vector the inverse operations to sampler STB and supplying a reconstructed image block ID. It is to be noted that if sampler STB had subtracted the mean value of the block from the actual value of the image samples, sampler STB is to supply the decoder, and more particularly CBR, with the relevant information, as schematized by the dotted line connection between STB and CBR.

What has been stated for luminance coding also can apply to chrominance component coding, e.g. in U and V form.

Figure 6:
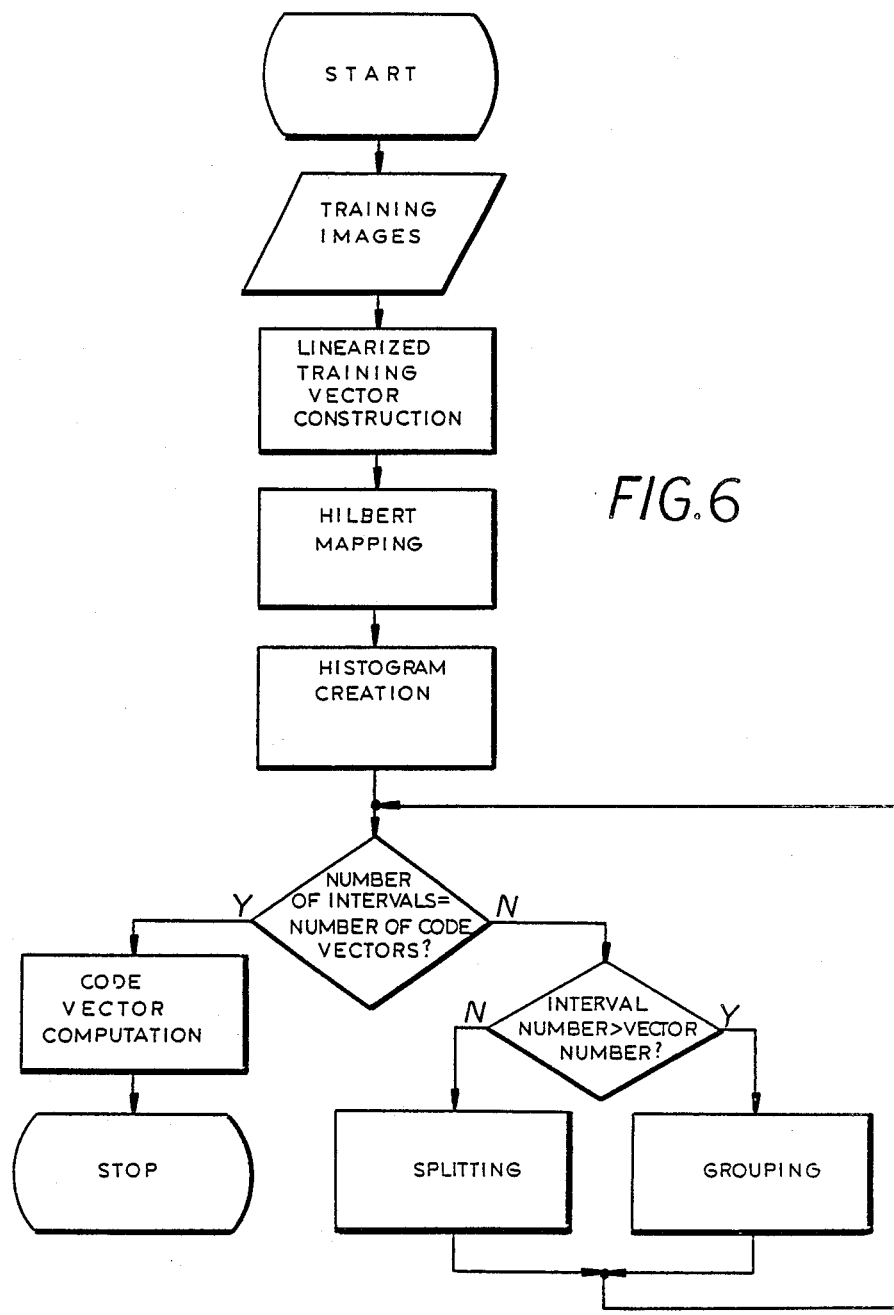
FIGS. 6 and 7are flow charts of codebook generation and coding operations.
Figure 7:
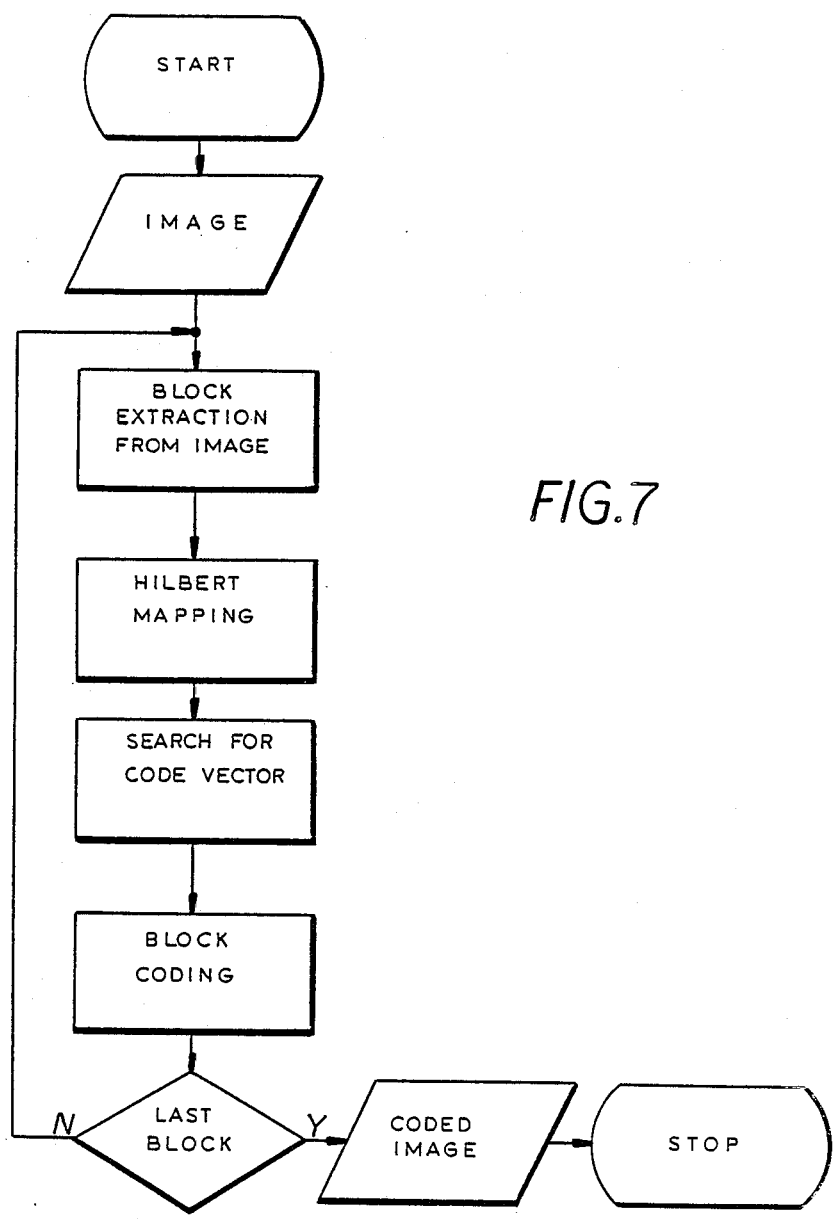

Codebook generation and coding operations, as just described, are also summarized in the algorithm flow charts of FIGS. 6, 7; these flow charts require not further explanations except to indicate that FIG. 6 represents formation of the codebook while FIG. 7 represents the processing of an image using same.

It is to be noted that a coding based on vector quantization is seriously affected by source non-stationariness: experimental tests have in fact demonstrated that coder performance is highly different according to whether or not the vectors to be coded belong to the training sequence.

To overcome this disadvantage the operations performed to obtain quantization law and codebook (HIST, QG, LUT) and to transfer the latter to the decoder ought to be carried out also during the actual coding phase, and not only during the training phase. In other words, the coder is to be rendered adaptative and is to contain also blocks HIST, QG and LUT, which will be enabled only during the codebook computation steps.

To render the coder adaptative various solutions are possible according to the nature of the signal to be coded. For example, if individual images are to be coded, statistical properties can be assumed to vary from image to image and hence each image ought to be associated with its codebook. On the contrary, if an image sequence is to be coded, the codebook can be updated at fixed time periods or even can be continuously calculated and the updating can be carried out in the decoder when the differences with respect to the previous one become significant.

Figure 8:
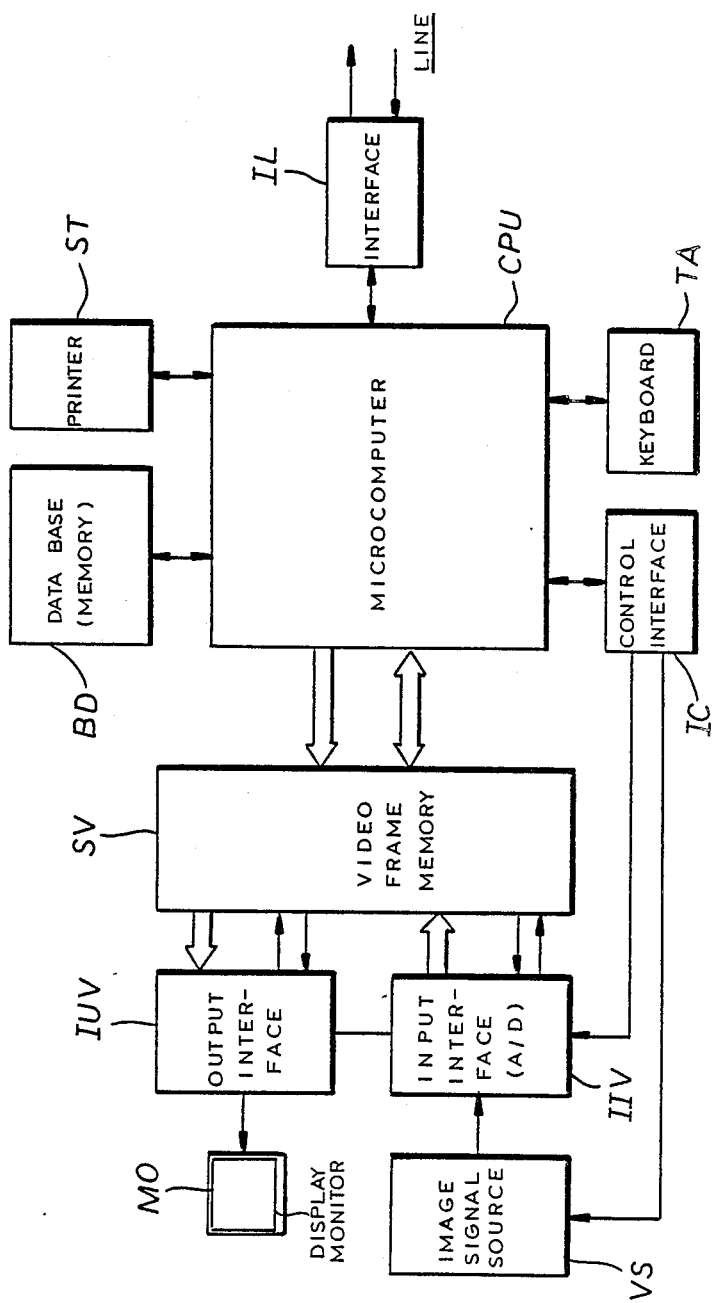
FIG. 8 is a block diagram of a practical embodiment of the device of FIG. 5.

FIG. 8 shows a preferred practical embodiment of the device of the invention, which makes use of a microcomputer indicated as a CPU, which carries out the operations of the devices of blocks DEC, COD in FIG. 5.

In FIG. 8, an image signal source VS of any known type, e.g. a television or a flying spot camera, supplies analog video signals to an input interface IIV, basically consisting of an anglogto digital converter and of devices selecting, in the signal flow, only the actual information signals. Source VS and output interface IVV are driven by CPU through a control interface IC controlling the movements of the image pick-up and/or analysis devices in VS; the control interface supplies timings necessary to image transfer to IIV, conversion into digital form, etc.

Digital information signals are stored in a video frame memory SV in a way depending on the image kind and the components used. This memory is not itself part of the invention.

Memory SV can be read or written at the addresses supplied by the microcomputer CPU, and CPU will have to choose every time the block to be coded memory. SV is also connected to an output interface IUV, this too controlled by control interface IC, carrying out functions opposite to those of IIV and allowing the display of coded or decoded images on a monitor MO.

The microcomputer CPU is associated with a mass memory or data base BD, wherein the coded images and the coding codebook or codebooks are stored. An interface IL connects the microcomputer CPU to a transmission line LINE, for image transfer to an analogous remote device. A keyboard TA allows the selection of various CPU operating modes; more particularly the following operations will be of interest for coding;
  codebook computation;
  image coding;
  codebook transmission;
  image transmission;
  reading/writing of the codebook in the data base; and
  reading/writing of an image in the data base.

The two latter operations are generally required in case of application of the invention to an image storage system. Further operations will generally concern image monitoring modalities as well as the modalities by which the service to be offered to customers is carried out.

It is clear that a plurality of functions can be combined together, according to the requirements of the demanded service. For instance, when applying the invention to a transmission system, at least image coding and transmission will be required, supposing that a standard codebook is used which requires no updating during the coding.

FIG. 8 also shows a conventional printer ST allowing an operator to be supplied with information on the device operation or the like.

It is clear that what has been described is susceptible of variations and modifications without departing from the scope of the invention. More particularly, instead of creating a histogram of the coordinates in the one-dimensional space, a list of the coordinate values can be created and the accumulation zones can be detected; code vectors are identified on the bases of these zones, as before. This operation is slower than histogram creation, yet it avoids the inconvenience, inherent in the latter owing to the truncation in LIM, of obtaining a reduced number of very high peaks, which gives rise to code vectors scarcely satisfactory in quantity and quality.

As a further variant, after the creation of the ordered list of the coordinates of the points of the training image set in the one-dimensional space, these points are subdivided into L groups (L being the number of intervals to be used for the coding); the coordinates of the end points of each interval will be the mean values of the coordinates of the last (first) point of a group and of the first (last) point of the subsequent (preceding) group.

We claim:
1. A method of coding a digital signal by vector quantization, which comprises the steps of:
  subdividing said signal into blocks to be coded in sequence and each comprising a predetermined number of samples which are coded at the same time, each block being representable as a vector identifying a point in an n-dimensional space, wherein n=the number of samples in a block, and having n components whose values represent the values of the individual samples;
  for each block to be coded, transforming the coordinates of the respective point in the n-dimensional space into the coordinates of a point in a one-dimensional space according to a mapping preserv- ing in the one-dimensional space adjacency properties of the n-dimensional space;

comparing the coordinates of the points in said one-dimensional space with coordinates of the end points of a plurality of adjacent intervals in said one-dimensional space, each interval being associated with an index forming a coded value of the end points of the respective interval and with respective ones of said vectors falling in said interval; and during decoding, selecting based upon said index a vector out of a previously determined codebook consisting of means values of the vectors falling in said interval.

2. The method defined in claim 1 wherein said mapping of the n-dimensional space into a one-dimensional space is performed by using a space filling curve.

3. The method defined in claim 1 wherein the signals to be coded are image signals and the point coordinates are luminance values or chrominance component values.

4. The method defined in claim 3 wherein the luminance values are normalized with respect to a block mean value.

5. A method of coding a digital signal by vector quantization, which comprises the steps of:
subdividing said signal into blocks to be coded in sequence and each comprising a predetermined number of samples which are coded at the same time, each block being representable as a vector identifying a point in an n-dimensional space, wherein n=the number of samples in a block, and having n components whose values represent the values of the individual samples;

for each block to be coded, transforming the coordinates of the respective point in the n-dimensional space into the coordinates of a point in a one-dimensional space according to a mapping preserving in the one-dimensional space adjacency properties of the n-dimensional space;

comparing the coordinates of the points in said one-dimensional space with coordinates of the end points of a plurality fo adjacent intervals in said one-dimensional space, each interval being associated with an index forming a coded value of the end points of the respective interval and with respective one of said vectors falling in said interval; and during decoding, selecting based upon said index a vector out of a previously determined codebook consisting of means values of the vectors falling in said interval, said codebook being determined by the steps of:
digital signals belonging to a training sequence are split into blocks of n samples;
for each block the coordinates of the representative point in the n-dimensional space are transformed into the coordinates of a point in a one-dimensional space, according to said mapping preserving the adjacency properties;
the coordinates of the points in the one-dimensional space are ordered to form an ordered coordinate set;
the ordered coordinate set is quantized according to a law which minimizes the mean square error so as to determine the end points of each said interval;
the coordinates of the end points of said intervals are memorized; and
means values of the coordinates of the blocks falling in each interval are calculated.

6. The method defined in claim 5 wherein said ordered coordinate set is obtained by the creation of an histogram of the coordinates, upon limitation of a number of values a coordinate can assume.

7. The method defined in claim 6 wherein said limitation is effected by a truncation of words representing the coordinates.

8. The method defined in claim 6 wherein said limitation is performed by normalizing a value of a generic coordinate with respect to a maximum value a coordinate can assume, according to relation $$\hat{H}i = \frac{K \cdot Hi}{H_m}$$

wherein $\hat{H}i$ is the normalized value of the generic coordinate Hi, $H_M$ is the maximum value, and K is the number of intervals to be used for the histogram.

9. The method defined in claim 5 wherein said ordered coordinate set is obtained by creating a list of values of the coordinates and indentifying accummulation points of said values of said coordinates.

10. The method defined in claim 5 wherein said ordered coordinate set is obtained by creating a list of values of the coordinates and by distributing the points extracted from the training sequence into a number of grups equal to said predetermined number of intervals in such a way that all intervals contain the the same number of points, the cooridnates of the end points of an interval being mean values of the coordinates of a last point of a group and of a first point of a subsequent group.

11. The method defined in claim 5 wherein said ordered coordinate set is obtained by creating a list of values of the coordinates and by distributing the points extracted from the training sequence into a number of groups equal to said predetermined number of intervals in such a way that all intervals contain the same number of points, the coordinates of the end points of an interval being means values of coordinates of a first point of a group and of a last point of a preceding group.

12. The method defined in calim 5 wherein the codebook is periodically updated during the coding.

13. The method defined in claim 5 wherein the codebook is calculated at each coding operation.

14. A device for coding a digital signal by vector quantization, which signal is subdivided into signal blocks to be coded in sequence and comprising each a predetermined number of samples which are coded at the same time, each block being representable as a vector identifying a point in an n-dimensional space, wherein n=the number of samples in a block, and having n components whose values represent the values of the individual samples, said device comprising:
a coder (COD) including:
means (STB) subdividing into blocks the signal to be coded and calculating, for each block, the coordinates of a representative point in the n-dimensional space,
a first logic network computing, for each block, a coordinate of a point which, in a one-dimensional space, corresponds to the point representative of the block in the n-dimensional space and forming values of one-dimensional coordinates, a first memory (QL) which stores values of coordinates of end points of a plurality of intervals the one-dimensional space is divided into, and an index associated with each interval, and a comparison logic network (Qi) which receives the one-dimensional coordinate of each signal block to be coded, compares such coordinate with those of the end points of said intervals to detect the interval where the coordinate falls, and reads in said first memory (QL) and suplies, as a coded signal, the value of the index of such an interval; and a decoder (DEC) comprising:
means (STB) building up again the block of samples starting from a vector and combining the blocks into a decoded signal, and a second memory (CBR), addressed during reading by said indexes and storing a codebook consisting of the means values of the signal blocks falling in each interval.

15. The device defined in claim 14 wherein said coder (COD) comprises means for comparing and/or updating the codebook, and including:

means (LIM, HIST) for ordering the values of the one-dimensional coordinates supplied by said first logic network (MH) to form an ordered coordinate set;

a device (QG) for quantizing the ordered coordinate set, which device determines the supplies to said first memory (QL) the values of the end points of said intervals of the one-dimensional space; and a mean value computing device (LTU) which, for each signal block, receives the values of the coordinates of such a block in the n-dimensional space from the means (STB) for subdividing the signal into blocks, and receives said indexed from said comparison logic network (QI), and calculates for each interval the means value of the blcoks whose cooridnates in the one-dimensional space fall in said interval, such means values being transferred into the memory (CBR) of the decoder.

16. The device defined in claim 15 wherein the means for ordering the coordinate values comprise a circuit (LIM) limiting a number of values the coordinates can assume to a limited number of values, and a third memory (HIST) presenting a number of positions equal to the limited number of values and storing, in each position, a number of said blocks.

17. The device defined in claim 15, wherein the coder and the decoder are implemented by a microprocessor (CPU) associated with a mass memory (BD) for storing the codebook and/or the coded signals, the microprocessor being associated with a keyboard allowing selection of one or of a plurality of different operation modes, more particularly: codebook generation; coding of a signal; reading-writing in the mass memory of the codebook and/or of the coded signal; transmission of the codebook and/or of the coded signal to a remote device.

* * * * *